United States Patent
Higashida et al.

(10) Patent No.: US 7,490,271 B2
(45) Date of Patent: *Feb. 10, 2009

(54) SEMICONDUCTOR DEVICE MOUNTING CHIP HAVING TRACING FUNCTION

(75) Inventors: Motoki Higashida, Hyogo (JP); Yusuke Matsunaga, Hyogo (JP)

(73) Assignee: Renesas Technology Corp., Chiyoda-Ku, Tokyo (JP)

(*) Notice: Subject to any disclaimer, the term of this patent is extended or adjusted under 35 U.S.C. 154(b) by 143 days.

This patent is subject to a terminal disclaimer.

(21) Appl. No.: 11/493,617

(22) Filed: Jul. 27, 2006

(65) Prior Publication Data

US 2006/0271828 A1   Nov. 30, 2006

Related U.S. Application Data

(63) Continuation of application No. 10/384,742, filed on Mar. 11, 2003, now Pat. No. 7,146,543.

(30) Foreign Application Priority Data

Sep. 4, 2002   (JP)   ............................ 2002-259036

(51) Int. Cl.
*G06F 11/00*   (2006.01)
(52) U.S. Cl. ........................................ 714/45; 324/763
(58) Field of Classification Search ................... 714/45; 324/755, 763; 712/32; 703/28
See application file for complete search history.

(56) References Cited

U.S. PATENT DOCUMENTS

| | | | |
|---|---|---|---|
| 4,868,712 A | 9/1989 | Woodman | |
| 5,642,479 A | 6/1997 | Flynn | |
| 5,805,865 A * | 9/1998 | Mimura et al. | 703/28 |
| 5,920,765 A | 7/1999 | Naum et al. | |
| 5,978,937 A | 11/1999 | Miyamori et al. | |
| 6,064,219 A | 5/2000 | Aigner | |
| 6,094,056 A | 7/2000 | Bardsley et al. | |
| 6,145,100 A | 11/2000 | Madduri | |
| 6,279,103 B1 | 8/2001 | Warren | |
| 6,611,434 B1 * | 8/2003 | Lo et al. | 361/760 |

(Continued)

FOREIGN PATENT DOCUMENTS

JP   4-77833   3/1992

(Continued)

OTHER PUBLICATIONS

Japanese Office Action, with English-Language Translation, dated Mar. 13, 2007.

*Primary Examiner*—Robert Beausoliel
*Assistant Examiner*—Philip Guyton
(74) *Attorney, Agent, or Firm*—Buchanan Ingersoll & Rooney PC (57) ABSTRACT

A trace chip monitors a signal between a target logic chip having a data processing circuit mounted thereon and a memory chip having a memory storing data to be used by the target logic chip mounted therein, and traces an operation of the target logic chip. As the trace chip is implemented by a chip separate from the target logic chip and a memory chip, a debugging circuit need not be added to mass-produced articles when the trace chip is not mounted to the mass-produced articles. Thus, manufacturing cost of the articles can be reduced.

10 Claims, 9 Drawing Sheets

SIP STRUCTURE BEFORE INSERTION OF TRACE CHIP

U.S. PATENT DOCUMENTS

| | | |
|---|---|---|
| 6,615,371 B2 | 9/2003 | McCullough et al. |
| 6,665,821 B1 | 12/2003 | Miyayama et al. |
| 6,732,304 B1 | 5/2004 | Ong |
| 6,813,732 B2 * | 11/2004 | Kurooka et al. ............... 714/45 |
| 6,836,814 B2 | 12/2004 | Takaoka et al. |
| 6,973,591 B2 * | 12/2005 | Debling ...................... 714/30 |
| 7,146,543 B2 * | 12/2006 | Higashida et al. ............. 714/45 |

FOREIGN PATENT DOCUMENTS

| | | |
|---|---|---|
| JP | 9-152979 | 6/1997 |
| JP | 10-032306 | 2/1998 |
| JP | 11-353205 | 12/1999 |
| JP | 2002-149442 A | 5/2002 |

* cited by examiner

SIP STRUCTURE BEFORE INSERTION OF TRACE CHIP

FIG.2B

SIP STRUCTURE AFTER INSERTION OF TRACE CHIP

FIG.3

FIG.4A SIDE VIEW

FIG.4B TOP VIEW

FIG.5A

SIP STRUCTURE BEFORE INSERTION OF TRACE CHIP

FIG.5B

SIP STRUCTURE AFTER INSERTION OF TRACE CHIP

SEMICONDUCTOR DEVICE MOUNTING CHIP HAVING TRACING FUNCTION

CROSS REFERENCE TO RELATED APPLICATIONS

This application is a continuation application of application Ser. No. 10/384,742, filed Mar. 11, 2003 now U.S. Pat. No. 7,146,543.

BACKGROUND OF THE INVENTION

1. Field of the Invention

The present invention relates to a tracing function used for debugging a system having a CPU (Central Processing Unit) mounted thereon and, more specifically, to a semiconductor device with a chip having a tracing function mounted in the same package that has the CPU mounted thereon.

2. Description of the Background Art

Recently, CPUs have come to be widely used in information equipment such as a personal computer and electric appliances for home use. In the development of the CPU itself and in the development of systems for the information equipment and electric appliances on which the CPUs are mounted, it is important to analyze program flow executed by the CPU.

In debugging a software of a system in which the CPU is mounted, an apparatus referred to as an ICE (In Circuit Emulator) traces a memory access state of the target CPU and the process of program execution, reads values of an internal register and the like, and generates trace information. A terminal such as a personal computer (hereinafter referred to as a PC) for analysis generally processes or analyzes the trace information provided by the ICE.

Particularly, when the target CPU is an ASIC (Application Specific Integrated Circuit) microcomputer, it is often the case that an interface for debugging is added to the target CPU, so as to absorb difference among specifications of various microcomputers and to enable debugging by a common ICE.

Figure 1:
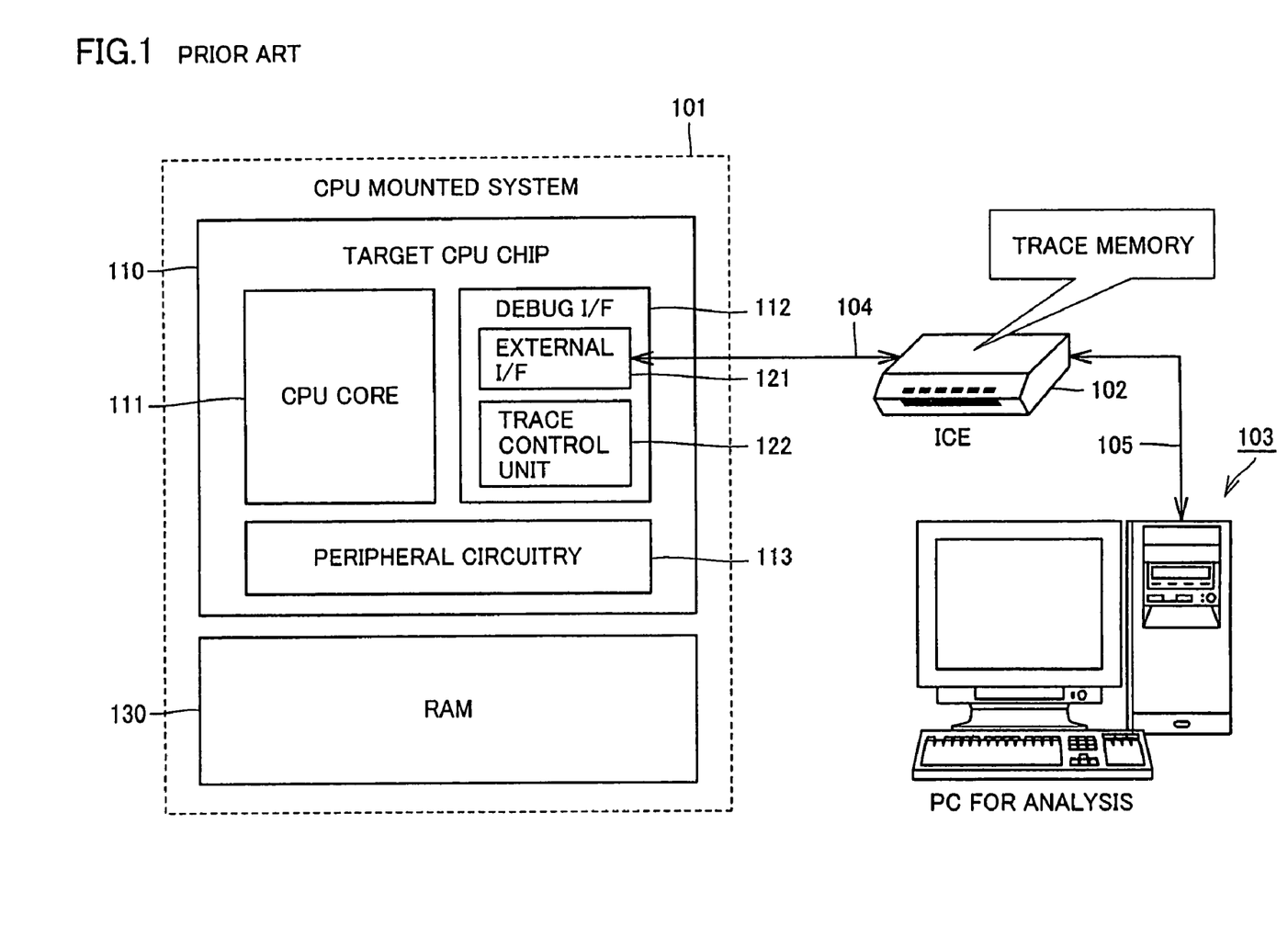
FIG. 1 is a block diagram illustrating a debugging environment of a conventional system on which a CPU is mounted.

FIG. 1 is a block diagram illustrating a debugging environment for a conventional system having a CPU mounted therein. The debugging environment includes a CPU mounting system 101, an ICE 102 and an analyzing PC 103.

ICE 102 reads an internal signal of a CPU core 111 output from CPU mounting system 101 through a processor probe 104, and stores trace information in an internal trace memory. Analyzing PC 103 receives the trace information from the trace memory inside ICE 102 through a terminal connection line 105, and presents the trace information to the user by displaying the trace information on a display screen, for example.

CPU mounting system 101 includes a target CPU chip 110, and a RAM 130. Further, target CPU chip 110 includes a CPU core 111, a debug I/F (Interface) 112 and a peripheral circuitry 113. Further, the debug I/F 112 includes an external I/F 121 and a trace control unit 122.

CPU core 111 reads data stored in RAM 130 or the like by fetching and executing an instruction, performs some processing on the data, stores the processing result again in RAM 130, and repeats such processing.

Trace control unit 122 monitors an operation of CPU core 111, and transfers data including a memory access history and an internal signal of CPU core 111 to ICE 102 through external I/F 121 and processor probe 104.

In the conventional debugging environment described above, target CPU chip 110 transfers memory access history and an internal signal of CPU core 111 to ICE 102 through processor probe 104. Therefore, when an operation frequency of target CPU chip 110 increases, it becomes difficult for ICE 102 to sample at every clock cycle the internal signals of CPU core 111 and to write to trace memory, because of stray capacitance of processor probe 104, for example.

Further, as the number of external pins of processor probe 104 is limited, it is difficult to output sufficient amount of trace information to ICE 102, resulting in a long time necessary for debugging.

Further, it is necessary to add a debugging interface in the target CPU chip 110. Therefore, the chip area increases and production yield decreases because of the addition of functional elements and wirings, resulting in higher chip cost.

SUMMARY OF THE INVENTION

An object of the present invention is to provide a semiconductor device that can perform tracing by using a chip that is the same as the one mounted in mass-produced articles.

Another object of the present invention is to provide a semiconductor device capable of tracing without the necessity of adding a debugging circuitry to a mass-produced article.

A still further object of the present invention is to provide a semiconductor device capable of tracing operation even when frequency of an internal signal of an object of tracing increases.

A still further object of the present invention is to provide a semiconductor device which enables longer tracing time.

A still further object of the present invention is to provide a semiconductor device capable of high speed transfer of the tracing information to the outside.

According to an aspect, the semiconductor device of the present invention includes a first chip as an object of tracing, having a data processing circuit mounted thereon, a second chip having a storage circuit storing data used by the first chip mounted thereon, and a third chip monitoring signals between the first and second chips and tracing an operation of the first chip, implemented by a chip separate from the first and second chips.

The third chip is implemented by a chip separate from the first and second chips. Therefore, when the third chip is not mounted on a mass-produced article, it means that a debugging circuit is not added to the mass-produced article, and therefore, manufacturing cost can be reduced. Further, as the third chip traces using the first and second chips that are mounted on the mass-produced article, tracing using a semiconductor device that is substantially the same as the mass-produced article becomes possible. Further, as the stray capacitance added to the internal signal of the first chip is reduced, tracing operation is possible even when the frequency of the internal signal of the first chip increases.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 2A:
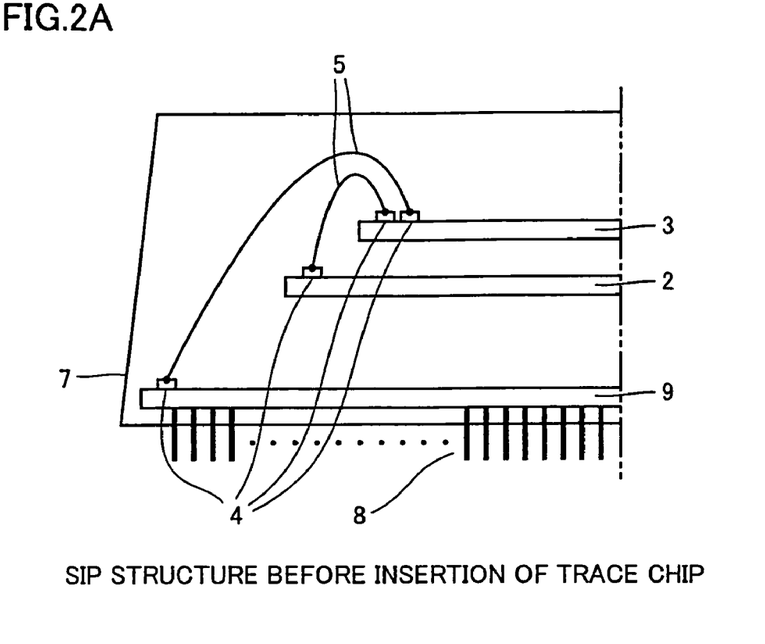
FIGS. 2A and 2B are side views representing a structure of a semiconductor device in accordance with a first embodiment.
Figure 2B:
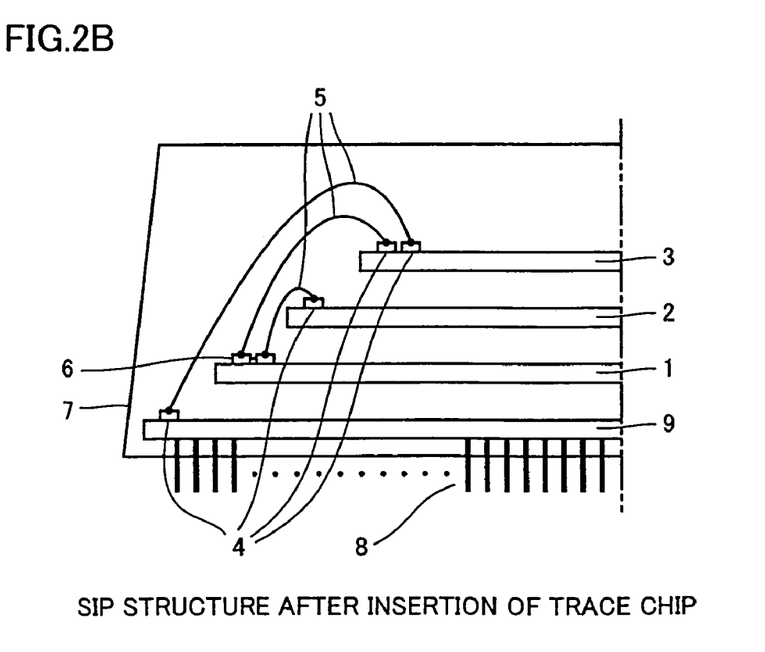

FIGS. 2A and 2B are side views representing a structure of a semiconductor device in accordance with the first embodiment of the present invention. The semiconductor device in accordance with the present embodiment has an SIP (System In Package) configuration, in which a trace chip is provided inside the semiconductor device for internal tracing.

FIG. 2A is a side view of a semiconductor device having the SIP configuration before a trace chip 1 is inserted. The semiconductor device includes a memory chip 2 provided in a mold 7, a target logic chip 3 performing data processing such as a CPU, and a frame 9 having a plurality of external input/output pins 8 for the package.

On memory chip 2, target logic chip 3 and frame 9, pads 4 for connecting wires between chips are provided. A pad 4 on frame 9 is connected by a wire 5 to a pad 4 on target logic chip 3. Further, a pad 4 on target logic chip 3 is connected by a wire 5 to a pad 4 on memory chip 2.

FIG. 2B is a side view of the semiconductor device having the SIP configuration after the trace chip 1 is inserted. Trace chip 1 is provided between memory chip 2 and frame 9. A pad 4 on frame 9 is connected by a wire 5 to a pad 4 of target logic chip 3. Further, a pad 4 on target logic chip 3 is connected by a wire 5 to a sample pad 6 on trace chip 1. Further, a sample pad 6 on trace chip 1 is connected by a wire 5 to a pad 4 on memory chip 2.

Figure 3:
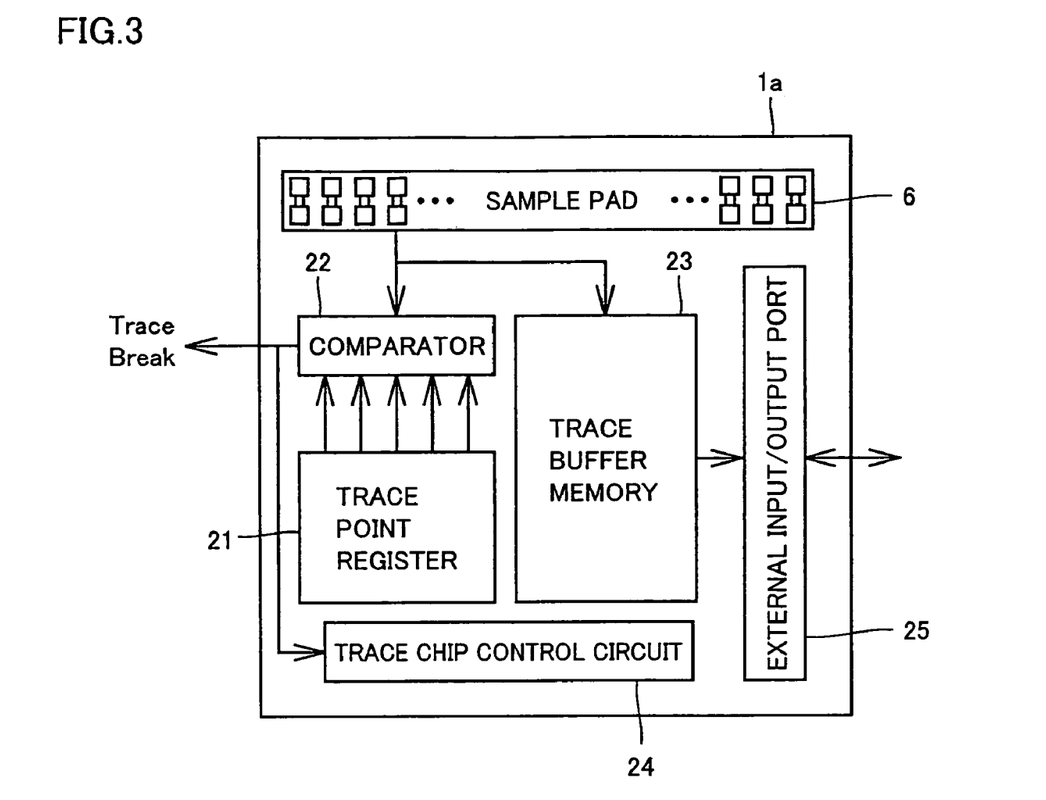
FIG. 3 is a block diagram representing a schematic configuration of a trace chip 1a in accordance with the first embodiment of the present invention.

FIG. 3 is a block diagram representing a schematic configuration of trace chip 1a in accordance with the first embodiment of the present invention. Trace chip 1a includes a sample pad 6, a plurality of trace point registers 21, a comparator 22, a trace buffer memory 23, a trace chip control circuit 24 and an external input/output port 25.

Sample pad 6 has such a configuration that has two pads connected, one of which is connected to a pad 4 on target logic chip 3 by the wire 5, and the other is connected to a pad 4 on memory chip 2 by the wire 5. Specifically, sample pad 6 is inserted between the wires between target logic chip 3 and memory chip 2, for reading information flowing through the wires.

Trace point register 21 is for storing a memory address to be monitored. Trace point register 21 is accessible by an external PC or the like, through external input/output port 25.

Comparator 22 compares a memory address stored in trace point register 21 with an address flowing through sample pad 6, and when these match, asserts a trace break signal.

Trace buffer memory 23 samples logic of a signal flowing through sample pad 6 at the same clock frequency as the clock used in the target logic chip 3, and holds the result.

Trace chip control circuit 24 controls comparator 22, trace buffer memory 23, external input/output port 25 and like, for overall control of trace chip 1a.

External input/output port 25 inputs information necessary for tracing such as a trace point set in trace point register 21, and externally outputs contents of trace memory buffer 23.

An example of one tracing operation will be described in the following. Trace chip 1a reads a signal flowing through sample pad 6, and detects a data write to memory chip 2 or data read from memory chip 2 by target logic chip 3. At this time, the signal flowing through sample pad 6 is input to comparator 22 and trace buffer memory 23. Trace buffer memory 23 successively samples signals flowing through sample pad 6, and stores the same as trace information.

Comparator 22 compares an address value of the trace point stored in advance in trace point register 21 with an address value read from sample pad 6, and when these match, asserts a trace break signal. When the address value do not match, tracing continues.

When the trace break signal is asserted or trace buffer memory 23 is full, trace control circuit 24 terminates tracing. When tracing is terminated, a terminal such as a PC provided outside reads and analyzes the trace information stored in trace buffer memory 23 through external input/output port 25.

In the semiconductor device of the present embodiment, target logic chip 3, memory chip 2 and trace chip 1 are arranged in this order inside the package of the semiconductor device. The order of arrangement of these chips is arbitrary, and when necessary, a plurality of trace chips may be arranged inside the package. Further, in FIG. 3, sample pad 6 is provided only on one side of trace chip 1a. However, it may be arranged at any position on trace chip 1a.

As described above, in the semiconductor device in accordance with the present embodiment, trace chip 1a reads communication between target logic chip 3 and memory chip 2 through sample pad 6, and therefore, tracing operation becomes possible without modifying the target logic chip 3 or memory chip 2. Further, as the tracing can be performed by using the same target logic chip 3 and memory chip 2 that are mounted on a mass-produced and shipped semiconductor device, debugging becomes possible by a semiconductor device which is substantially the same as mass-produced devices.

Further, the trace chip 1 is not mounted on the mass-produced semiconductor device. Therefore, it becomes unnecessary to add a debugging circuit to the mass-produced semiconductor device, and therefore, the cost of manufacturing the semiconductor devices can be reduced.

When an internal signal of the semiconductor device is read by an ICE through external pins as in the conventional debugging environment, internal signals that can be monitored would be limited by the limited number of external pins. When trace chip 1 is provided inside the package of the semiconductor device, trace information is stored in trace buffer memory 23 and externally output through external input/output port 25 as in the semiconductor device in accordance with the present embodiment, it becomes possible to trace a large amount of internal signals, not limited by the number of external pins.

When a state of an external signal line is read by the ICE through the processor probe as in the conventional debugging environment, a large stray capacitance is generated on the external signal line, limiting traceable frequency. When the trace chip 1 is provided inside the package of the semiconductor device as in the semiconductor device in accordance with the present embodiment, the stray capacitance can be reduced, and therefore, tracing is possible even when the frequency of the internal signal increases.

Second Embodiment

Figure 4A:
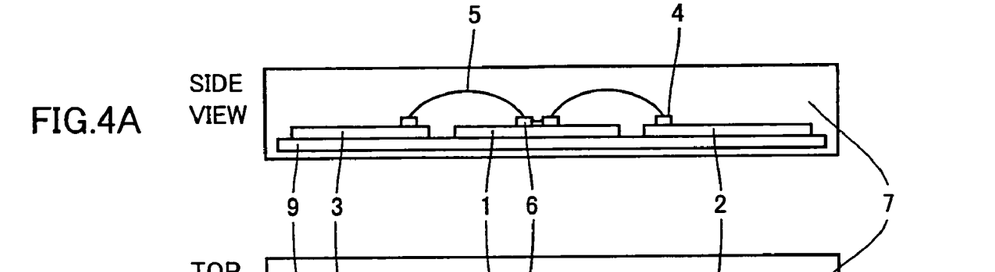
FIGS. 4A and 4B represent a structure of a semiconductor device in accordance with a second embodiment.
Figure 4B:
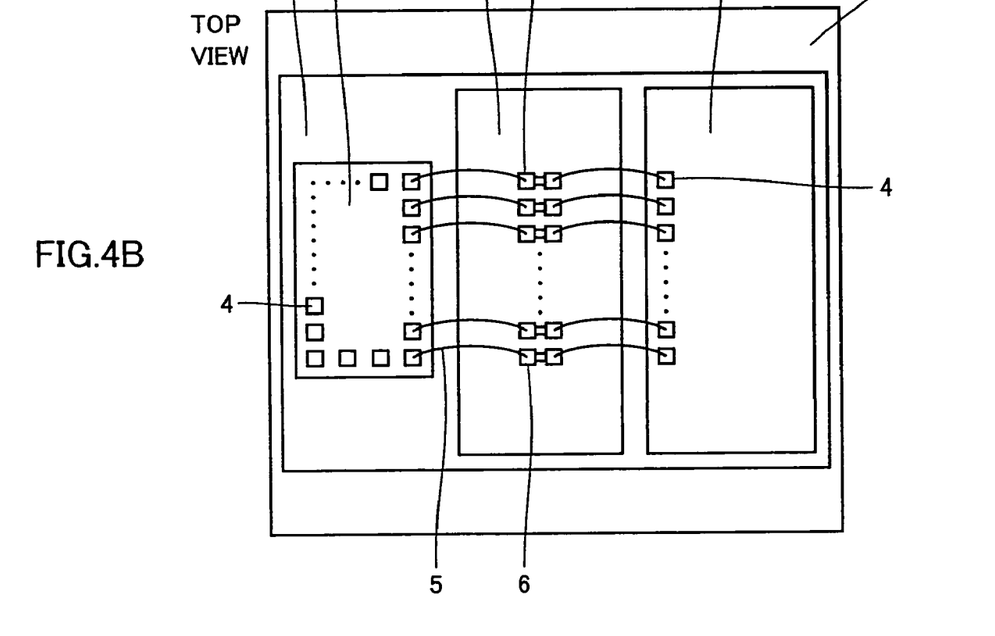

FIG. 4A is a side view representing a structure of a semiconductor device in accordance with the second embodiment of the present invention, and FIG. 4B is a top view thereof. The configuration of the semiconductor device in accordance with the present embodiment is different from the configuration of the semiconductor device in accordance with the first embodiment shown in FIG. 2B only in the arrangement of trace chip 1, target logic chip 3 and memory chip 2. Therefore, detailed descriptions of the overlapping configurations and functions will not be repeated.

In a stacked type MCP (Multi Chip Package) in which trace chip 1, target logic chip 3 and memory chip 2 are mounted overlapping with each other, the three chips are overlapped in the height direction, and therefore, wire bonding positions of respective chips come very close with each other. Therefore, it becomes difficult to control loops to prevent contact between upper and lower wires and to control loop to prevent contact of a wire to a chip edge.

When chip sizes differ significantly, wire bonding with very short and long loops combined becomes necessary, making wire bonding more difficult. Further, as the wires are close to each other in the upward/downward directions, wire contact is very likely when a wire is deformed at the time of sealing in the mold, and therefore, the molding step also becomes difficult.

In the present embodiment, a plane type MCP is used in which trace chip 1, target logic chip 3 and memory chip 2 are arranged laterally as shown in FIGS. 4A and 4B. Therefore, wires connecting chips with each other are not overlapped. Further, as the chips are arranged on one same plane, contact between a chip edge and a wire is less likely, and assembly is easier.

In FIGS. 4A and 4B, sample pad 6 is arranged at the center of trace chip 1. Sample pad 6, however, may be arranged at any position of chip 1.

Third Embodiment

Figure 5A:
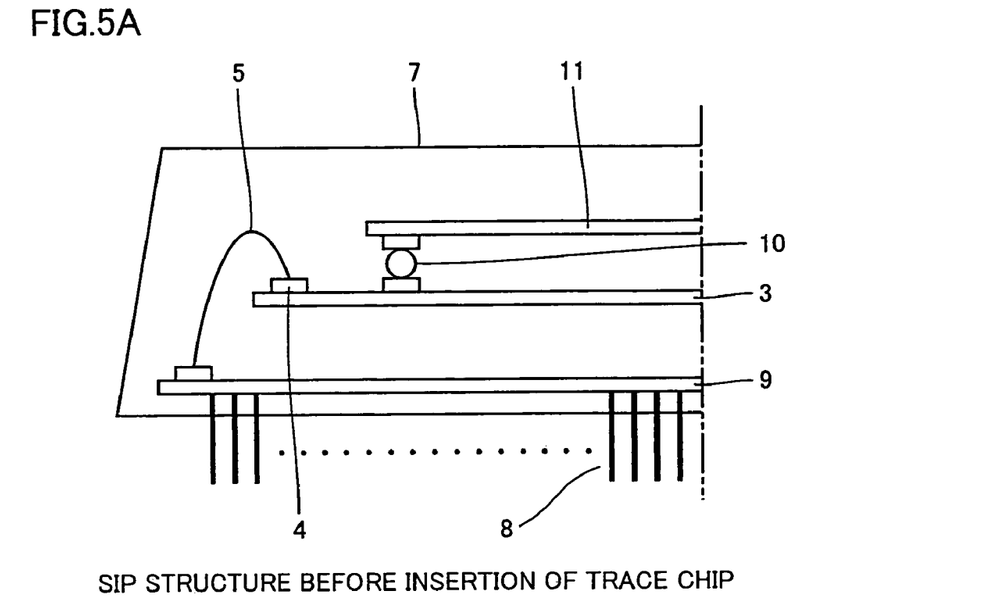
FIGS. 5A and 5B are side views representing a structure of a semiconductor device in accordance with a third embodiment of the present invention.
Figure 5B:
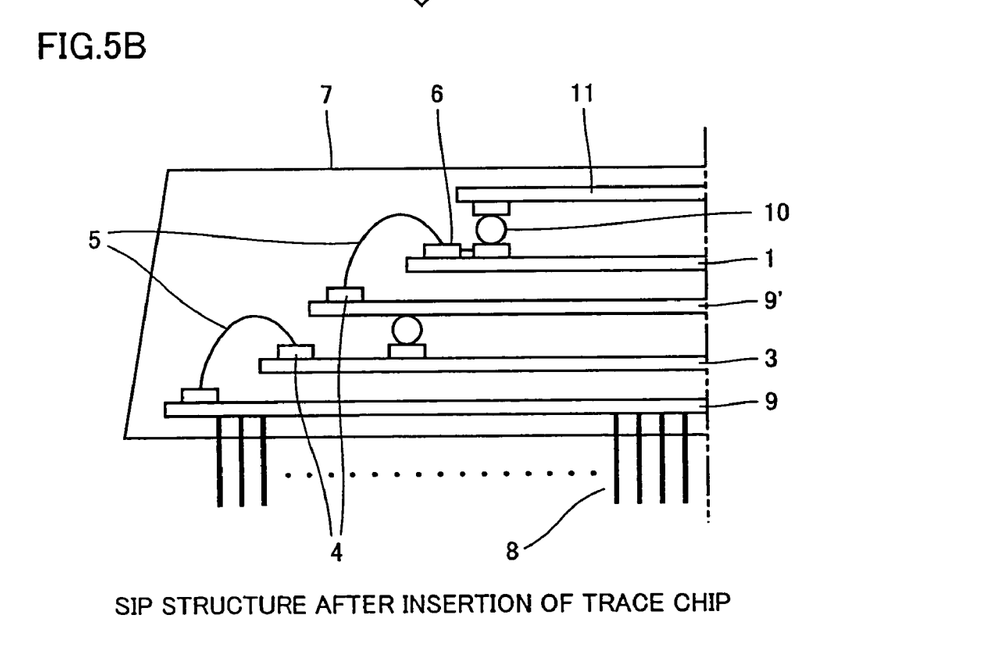

FIGS. 5A and 5B are side views representing a structure of a semiconductor device in accordance with the third embodiment of the present invention. The semiconductor device of the present embodiment is an SIP having a flip chip connection structure. FIG. 5A is a side view of the semiconductor device having the flip chip connection structure before trace chip 1 is inserted.

The semiconductor device includes a target logic chip 3 for performing data processing such as a CPU provided in mold 7, a frame 9 having a plurality of external input/output pins 8 of the package, and a memory chip 11 for flip chip connection. A pad 4 of target logic chip 3 is connected by a solder ball 10 to a pad 4 of memory chip 11.

FIG. 5B is a side view of the semiconductor device having the flip chip connection structure after trace chip 1 is inserted. Between memory chip 11 and target logic chip 3, trace chip 1 and a frame 9' are inserted. A pad 4 on target logic chip 3 is flip-connected by a solder ball to frame 9'. Further, one pad of sample pads 6 on trace chip 1 is flip-connected by a solder ball to a pad 4 on memory chip 11. Further, the other pad of sample pads 6 on trace chip 1 is connected by a wire to a pad 4 on frame 9'.

In the flip chip connection, a solder bump or a gold bump is formed in advance on a bonding pad of a chip, the bump and the corresponding pad on the chip are registered with the chip turned upside down, and a connection is established by thermal solder reflow or ultrasonic vibration under pressure. In this manner, in an SIP of a flip chip connection, tracing of the target logic chip 3 also becomes possible in a similar manner to the first embodiment.

In the flip chip connection, wire bonding using wires is not performed, and therefore, line delay through the wires can be reduced and higher speed of operation of target logic chip 3 becomes possible. When wire bonding is employed, the height of the wire loop is a factor that determines the height of the package. When the flip chip configuration is used, the necessity of the loop is eliminated, and therefore, the height of the package can be reduced. Though a memory chip 11 is arranged on target logic chip 3 in the present embodiment, the chip positions may be reversed.

Fourth Embodiment

Figure 6:
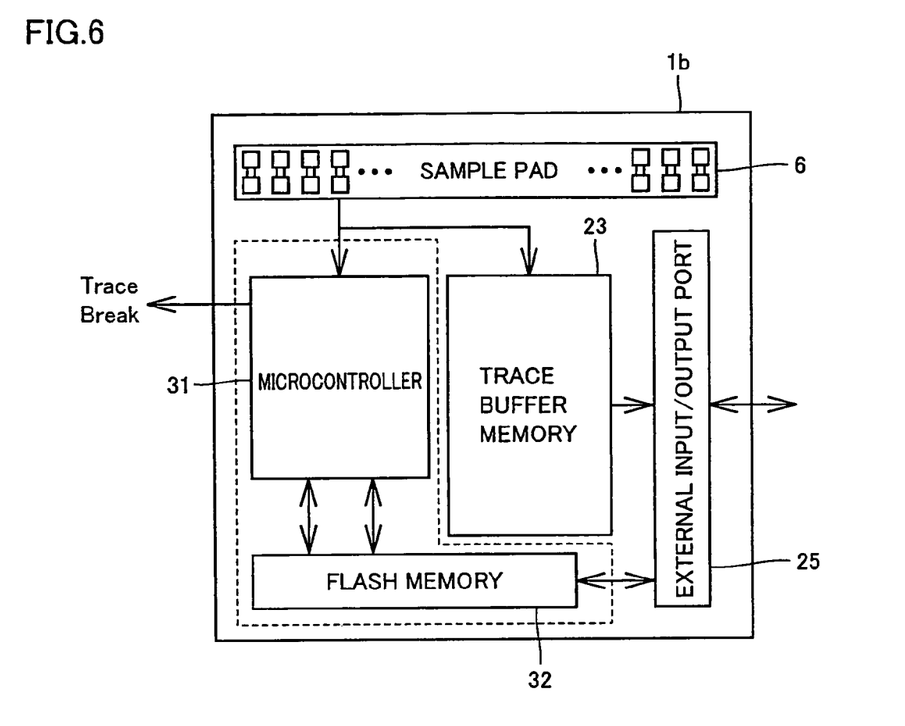
FIG. 6 is a block diagram representing a schematic configuration of a trace chip provided in the semiconductor device in accordance with a fourth embodiment of the present invention.

FIG. 6 is a block diagram representing a schematic configuration of a trace chip provided in the semiconductor device in accordance with the fourth embodiment of the present invention. Trace chip 1b includes a sample pad 6, a trace buffer memory 23, an external input/output port 25, a micro controller 31 and a flash memory 32. Portions having the same configuration and function as those of trace chip 1a in accordance with the first embodiment shown in FIG. 3 are denoted by the same reference characters.

In the trace chip 1a in accordance with the first embodiment, the memory access information read from the sample pad 6 is compared with the address stored in trace point register 21 by comparator 22, and whether the tracing should be started, continued or stopped is determined.

In the trace chip 1b in accordance with the fourth embodiment, a program for determining execution, termination and like of tracing is stored in advance in flash memory 32, and microcontroller 31 controls tracing in accordance with the program stored in flash memory 32. It is possible for a terminal provided outside, such as a PC, to store information such as a program in flash memory 32 through external input/output port 25.

When tracing starts, microcontroller 31 starts monitoring the access information read from sample pad 6, in accordance with the program stored in flash memory 32. When the memory access satisfies a prescribed condition such as an access to a specific address, writing of a prescribed data to the memory or reading of prescribed data from the memory, microcontroller 31 asserts a trace break signal, and terminates tracing.

As described above, in the semiconductor device in accordance with the present embodiment, microcontroller 31 controls tracing in accordance with the program stored in flash memory 32. Therefore, in addition to the effect described with respect to the first embodiment, it becomes possible to readily change the method of tracing, by changing the program stored in flash memory 32.

Further, by changing the program, it also becomes possible to set a complicated trace condition that depends on the order of memory accesses. Further, as it is possible to handle various different target logic chips and memory chips by changing the program, the trace chip can be used for general purposes.

Fifth Embodiment

Figure 7:
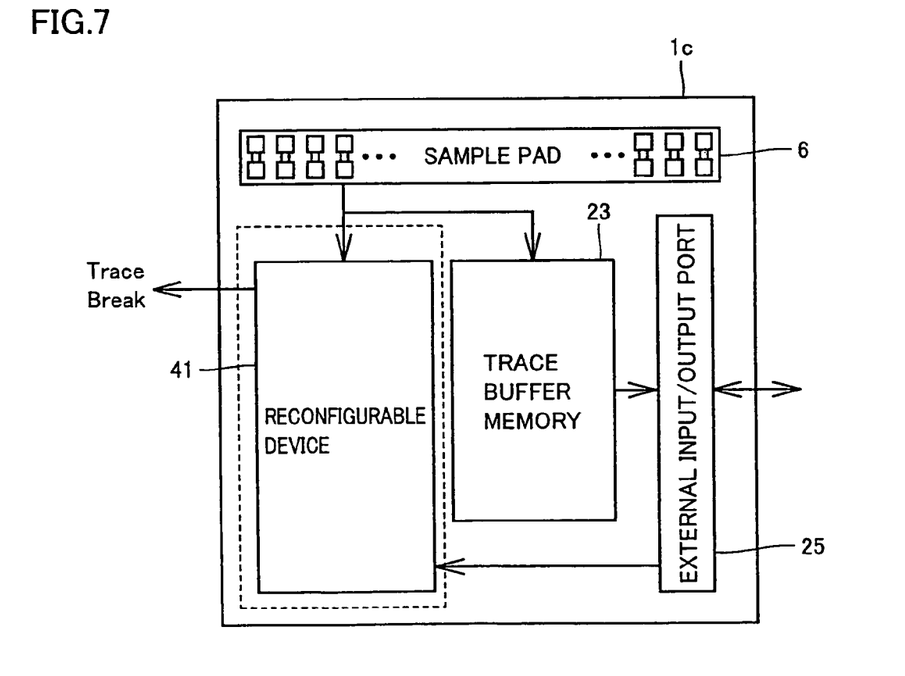
FIG. 7 is a block diagram representing a schematic configuration of a trace chip provided in a semiconductor device in accordance with a fifth embodiment of the present invention.

FIG. 7 is a block diagram representing a schematic configuration of a trace chip provided in the semiconductor device in accordance with the fifth embodiment of the present invention. The trace chip 1c includes a sample pad 6, a trace buffer memory 23, an external input/output port 25, and a reconfigurable device 41. Portions having the same configuration and function as those of trace chip 1a in accordance with the first embodiment shown in FIG. 3 are denoted by the same reference characters.

In the trace chip 1a in accordance with the first embodiment, the memory access information read from sample pad 6 is compared with the address stored in trace point register 21 by comparator 22, and whether tracing is to be started, continued or broken is determined.

In trace chip 1c in accordance with the fifth embodiment, a reconfigurable device 41 such as a PLD (Programmable Logic Device) or a FPGA (Field Programmable Gate Array) reads memory access information from sample pad 6, and when the memory access information satisfies a prescribed condition, asserts the trace break signal to terminate tracing. It is possible for an externally provided terminal such as a PC to set circuit information in reconfigurable device 41 through external input/output port 25, to form a trace circuit such as a sequencer.

As described above, in the semiconductor device in accordance with the present embodiment, reconfigurable device 41 controls tracing. Therefore, in addition to the effects described with respect to the first embodiment, the tracing method can readily be changed by changing the circuit configuration of reconfigurable device 41.

Further, by changing circuit configuration, it becomes possible to set a complicated trace condition that depends on internal state of target logic chip 3. Further, it is possible to handle various different target logic chips and memory chips by changing the circuit configuration, and the trace chip can be used for general purposes. Further, as a hardware such as a sequencer can be formed on trace chip 1c by reconfigurable device 1, high speed tracing becomes possible.

Sixth Embodiment

Figure 8:
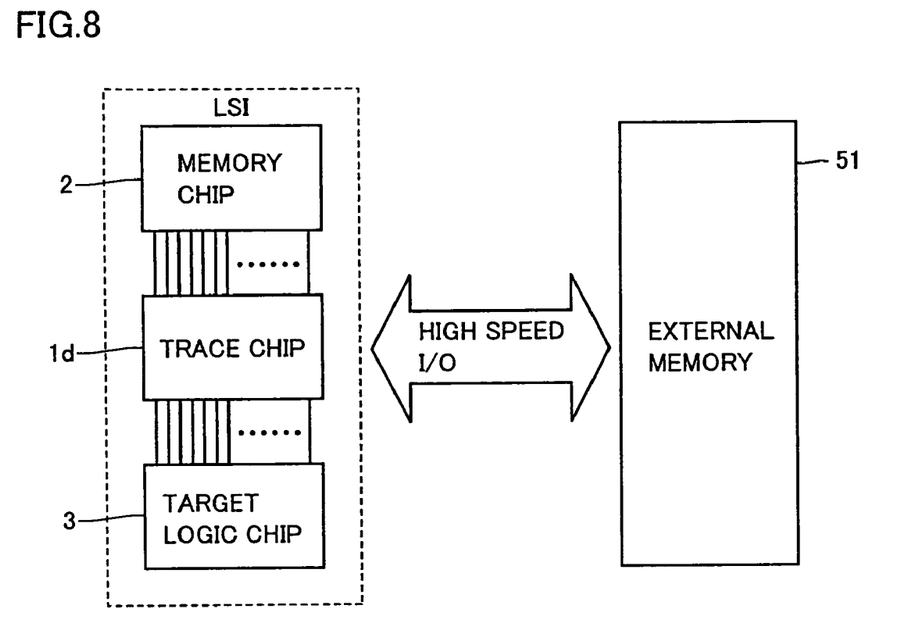
FIG. 8 is a block diagram representing a schematic configuration of a semiconductor device and an external memory connected thereto, in accordance with a sixth embodiment of the present invention.

FIG. 8 is a block diagram showing a schematic configuration of a semiconductor device and an external memory connected thereto in accordance with a sixth embodiment of the present invention. In the first to fifth embodiments, once tracing is terminated, an externally provided terminal such as a PC reads the tracing information stored in trace buffer memory 23 through external input/output port 25. Specifically, the amount of trace information that can be stored in trace buffer memory 23 is limited, and therefore, when trace buffer memory 23 becomes full, tracing must be once terminated to read the trace information by a terminal such as the PC.

In the semiconductor device in accordance with the sixth embodiment of the present invention, a high speed I/O in accordance with USB (Universal Serial Bus) 2.0, IEEE (the Institute of Electrical and Electronics Engineers, Inc) 1394 or the like is added to external input/output port 25, and using the high speed I/O, the trace information is transferred at high speed to external memory 51 during tracing operation.

The high speed I/O may have the rate equal to or higher than the tracing rate. External memory 51 is provided outside the semiconductor device, and it may be a DRAM (Dynamic Random Access Memory) having performance compatible with the transfer rate of the high speed I/O.

In the semiconductor device in accordance with the present embodiment, a high speed I/O is added to external input/output port 25, and trace buffer memory 23 is used as an FIFO (First In First Out). Therefore, the trace information can be externally output in parallel with the tracing operation, and therefore, the tracing time can be made significantly longer.

Seventh Embodiment

Figure 9:
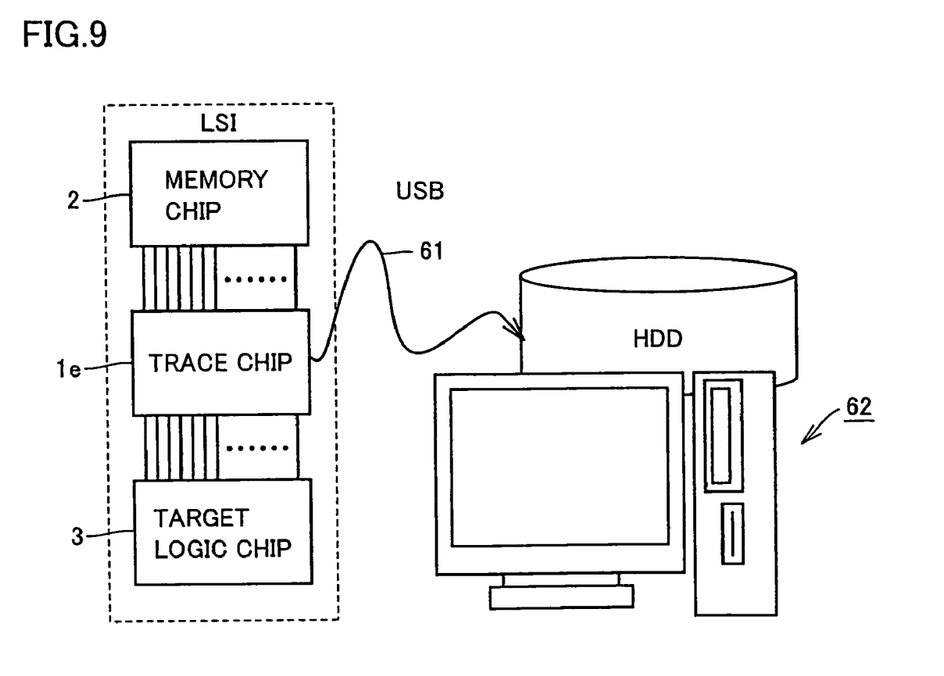
FIG. 9 is a block diagram representing a schematic configuration of a semiconductor device and an analyzing PC connected thereto, in accordance with a seventh embodiment of the present invention.

FIG. 9 is a block diagram representing a schematic configuration of the semiconductor device and an analyzing PC connected thereto in accordance with the seventh embodiment. In the semiconductor device of the present embodiment, a USB interface is added to the trace chip, and an externally provided PC 62 can directly read trace information from the semiconductor device through the USB 61.

As the USB interface is incorporated in trace chip 1, it becomes unnecessary to connect a data reading ICE that has been necessary in the prior art. Further, simply by providing an I/O pin for the USB interface on the semiconductor device, the trace information can be transmitted to PC 62. Therefore, as compared with connection of the ICE, the number of I/O pins can be reduced.

Further, as the trace buffer memory on trace chip 1 is utilized as the FIFO buffer, the USB interface can transfer the trace information to PC 62. Further, as the destination of storage of trace information, an HDD (Hard Disk Drive) of the PC 62 can be used, whereby the tracing time can be made significantly longer.

In the present embodiment, connection between the trace chip 1 and a PC 62 is established by USB. Any interface including Bluetooth may be used, provided that connection can be established between trace chip 1 and PC 62.

Eighth Embodiment

Figure 10:
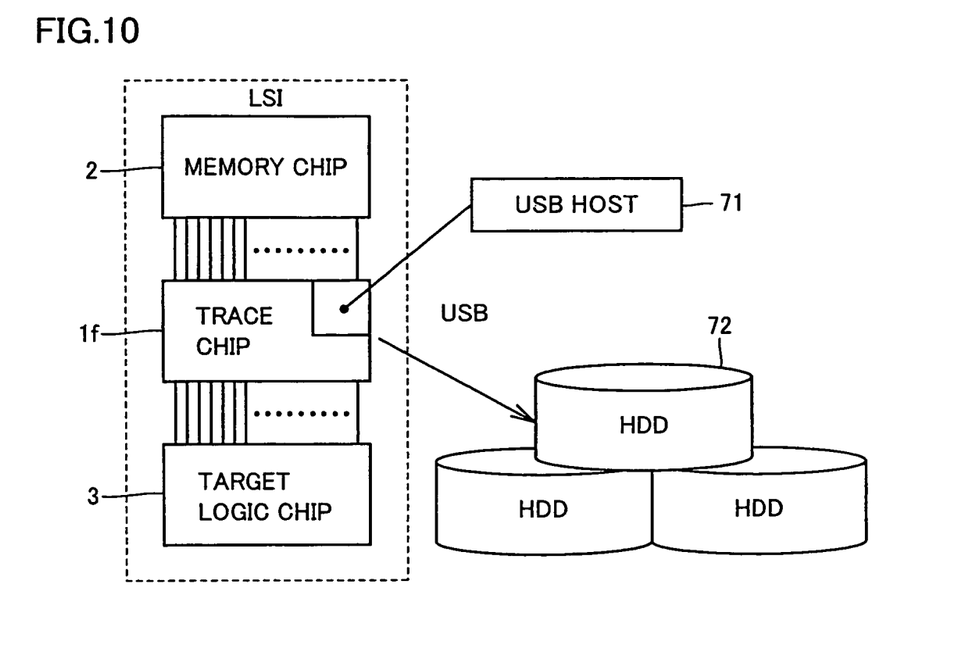
FIG. 10 is a block diagram representing a schematic configuration of a semiconductor device and an HDD connected thereto in accordance with an eighth embodiment of the present invention.

FIG. 10 is a block diagram representing a schematic configuration of the semiconductor device and an HDD connected thereto in accordance with the eighth embodiment of the present invention. In the semiconductor device of the present embodiment, a USB host function 71 is added to the trace chip, and the USB host function 71 can directly transfer the trace information to the externally provided HDD 72.

In the seventh embodiment, PC 62 reads the trace information through the USB interface. When PC 62 is involved in trace information transfer, the data transfer rate becomes slower. In the eighth embodiment of the present invention, the USB host function 71 is added to trace chip 1f, and the trace information is directly transferred to externally provided HDD 72.

Control of USB host function 71 is performed by microcontroller 31 shown in FIG. 6, reconfigurable device 41 shown in FIG. 7 or the like. As USB host function 71 is added to trace chip 1f and the trace information stored in trace buffer memory 23 is directly transferred to the HDD 72 by the USB host function 71 in this manner, the data transfer rate of the trace information can be improved, in addition to the effects described with respect to the first embodiment.

Ninth Embodiment

Figure 11:
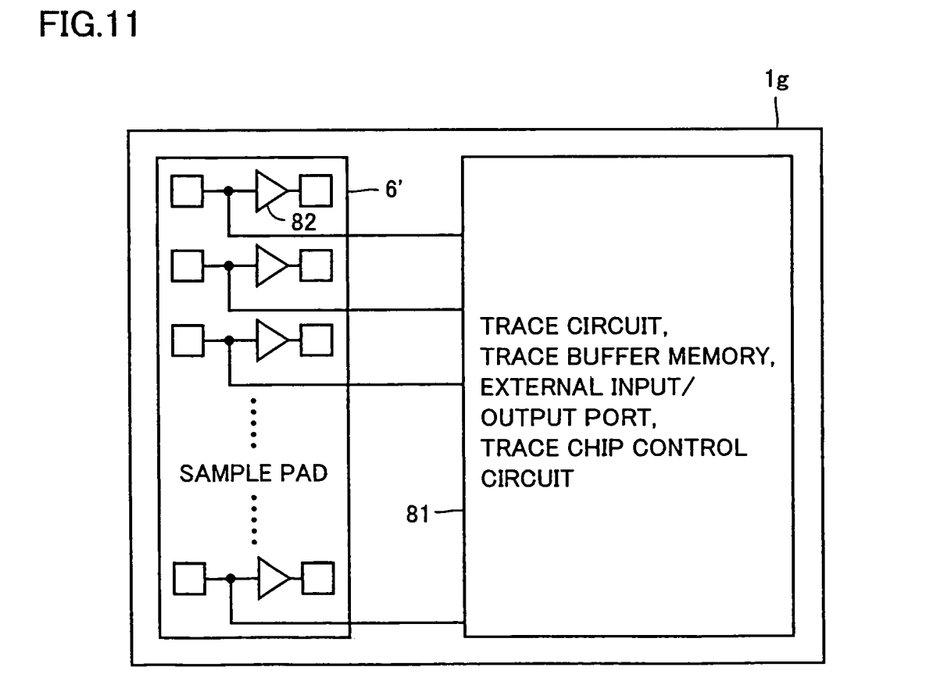
FIG. 11 is a block diagram representing a schematic configuration of a trace chip provided in a semiconductor device in accordance with a ninth embodiment of the present invention.

FIG. 11 is a block diagram showing a schematic configuration of the trace chip in accordance with the ninth embodiment of the present invention. The trace chip 1g in accordance with the present embodiment differs from the trace chip shown in FIG. 3, 6 or 7 in sample pad configuration. Detailed description of overlapping configurations and functions will not be repeated. In the present embodiment, the trace circuit, the trace buffer memory, the external input/output port and trace chip control circuit will be generally referred to as circuitry 81, and sample pad will be denoted by the reference character 6' for the following description.

Trace chip 1g of the present embodiment includes a sample pad 6' and circuitry 81. Sample pad 6' has such a configuration that two pads are connected to each other through a relay driver 82. To the pads on the side where target logic chip 3 is connected (the side of input terminal of driver 82), terminals of various circuits included in circuitry 81 are connected. Driver 82 amplifies a signal transmitted from target logic chip 3 to memory chip 2 or 11, or a signal transmitted from memory chip 2 or 11 to target logic chip 3.

By such a configuration, a monitor signal that has been made dull by the influence of stray capacitance of sample pad 6', for example, can be corrected, and therefore, undesirable effect on signal transmission between target logic chip 3n and memory chip 2 or 11 can be reduced.

Tenth Embodiment

Figure 12:
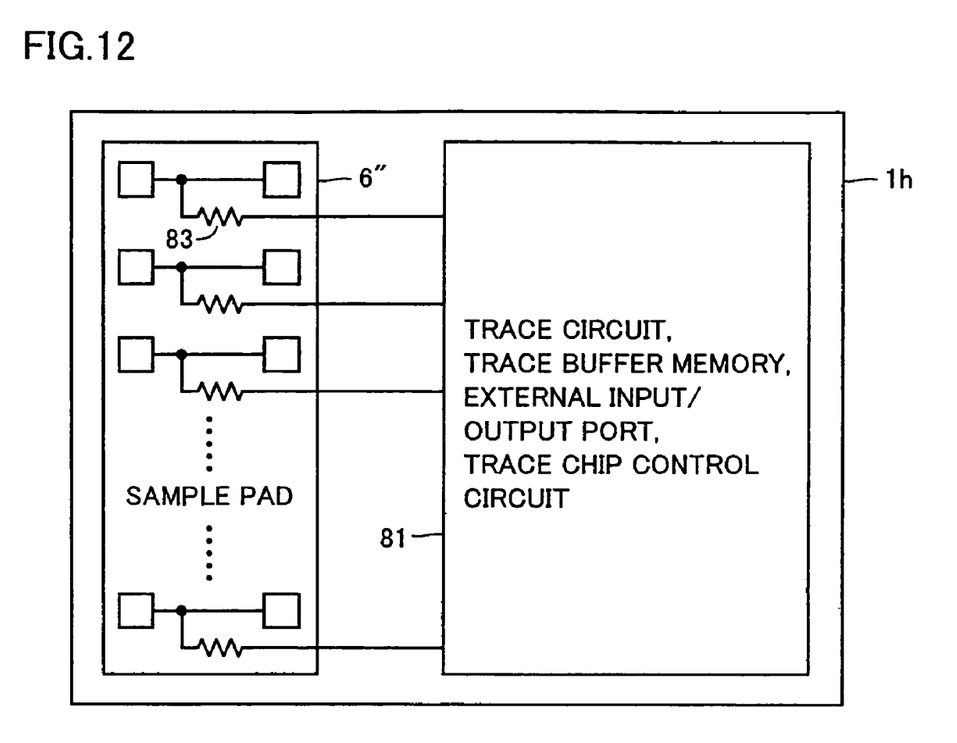
FIG. 12 is a block diagram representing a schematic configuration of a trace chip provided in a semiconductor device in accordance with a tenth embodiment of the present invention.

FIG. 12 is a block diagram representing a schematic configuration of the trace chip in accordance with the tenth embodiment. The trace chip 1h in accordance with the present embodiment differs from the trace chip shown in FIG. 3, 6 or 7 in sample pad configuration. Therefore, detailed description of overlapping configurations and functions will not be repeated. In the present embodiment, the trace circuit, the trace buffer memory, the external input/output port and the trace chip control circuit will be generally referred to as circuitry 81, and the sample pad will be denoted by the reference character 6" for the following description.

The trace chip 1h in accordance with the present embodiment includes a sample pad 6" and circuitry 81. Sample pad 6" has such a configuration that a terminating resistance 83 is connected to a line connecting two pads. The other end of terminating resistance 83 is connected to a terminal of each of the circuits included in circuitry 81.

By such a configuration, signal reflection generated in sample pad 6" at the time of high speed operation can be suppressed and noise can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first chip as an object of tracing and having a data processing circuit mounted thereon;
   a second chip having a storage circuit storing data used by said first chip mounted thereon; and
   a third chip monitoring a signal between said first chip and said second chip and tracing an operation of said first chip, and formed by a chip separate from said first and second chips, wherein said third chip is connected directly to at least one of the first and second chips;
   wherein said semiconductor device is a stacked type multichip package having said first, second and third chips mounted in a height direction;
   wherein said third chip includes
      a sample pad inserted between a wiring between said first and second chips,
      a trace circuit monitoring a signal flowing through the sample pad and controlling tracing of said first chip,
      a first storage circuit successively storing the signal flowing through the sample pad as trace information, and
      an external input/output port externally outputting the trace information stored in said first storage circuit and externally receiving data as an input for setting of said trace circuit; and
   wherein said trace circuit includes
      a trace point register storing a memory address to be monitored,
      a comparing circuit comparing an address flowing through said sample pad with the memory address stored in said trace point register, and
      a control circuit controlling progress of tracing based on a result of comparison by said comparing circuit.

2. The semiconductor device according to claim 1, wherein connection of said first, second and third chips is made by wire bonding.

3. The semiconductor device according to claim 1, wherein at least part of connection of said first, second and third chips is made by flip chip connection.

4. The semiconductor device according to claim 1, wherein said trace circuit includes a second storage circuit storing a program for controlling tracing, and a microcontroller controlling tracing by monitoring the signal flowing through said sample pad, in accordance with the program stored in said second storage circuit.

5. The semiconductor device according to claim 1, wherein said trace circuit includes a reconfigurable device having a circuitry reconfigurable by external information, for controlling tracing by monitoring the signal flowing through said sample pad.

6. The semiconductor device according to claim 1, wherein said third chip further includes a high speed I/O externally outputting trace information storage in said first storage circuit at high speed.

7. The semiconductor device according to claim 1, wherein said third chip further includes an USB interface externally outputting trace information stored in said first storage circuit.

8. The semiconductor device according to claim 1, wherein said third chip further includes a USB host function externally outputting trace information stored in said first storage circuit.

9. The semiconductor device according to claim 1, wherein said sample pad includes a first pad connected to said first chip by a wire, a second pad connected to said second chip by a wire, and a driver connected between said first and second pads.

10. A semiconductor device comprising:
  a first chip as an object of tracing and having a data processing circuit mounted thereon;
  a second chip having a storage circuit storing data used by said first chip mounted thereon; and
  a third chip monitoring a signal between said first chip and said second chip and tracing an operation of said first chip, and formed by a chip separate from said first and second chips, wherein said third chip is connected directly to at least one of the first and second chips;
  wherein said semiconductor device is a plane type multi-chip package having said first, second and third chips mounted in a horizontal direction;
  wherein said third chip includes
    a sample pad inserted between a wiring between said first and second chips,
    a trace circuit monitoring a signal flowing through the sample pad and controlling tracing of said first chip,
    a first storage circuit successively storing the signal flowing through the sample pad as trace information, and
    an external input/output port externally outputting the trace information stored in said first storage circuit and externally receiving data as an input for setting of said trace circuit; and
  wherein said trace circuit includes
    a trace point register storing a memory address to be monitored,
    a comparing circuit comparing an address flowing through said sample pad with the memory address stored in said trace point register, and
    a control circuit controlling progress of tracing based on a result of comparison by said comparing circuit.

* * * * *